United States Patent
Platzer et al.

[11] Patent Number: 5,725,992
[45] Date of Patent: *Mar. 10, 1998

[54] PROCESS FOR THE PRODUCTION OF A MULTICOLORED IMAGE AND PHOTOSENSITIVE MATERIAL FOR CARRYING OUT THIS PROCESS

[75] Inventors: Stephan J. W. Platzer, Eltville/Erbach, Germany; Wojciech A. Wilczak, Jersey City, N.J.; Gerhard Buhr, Koenigstein; Dieter Mohr, Budenheim, both of Germany

[73] Assignee: Agfa-Gevaert AG, Leverkusen, Germany

[*] Notice: The term of this patent shall not extend beyond the expiration date of Pat. No. 5,534,384.

[21] Appl. No.: 20,829

[22] Filed: Feb. 19, 1993

[30] Foreign Application Priority Data

Feb. 19, 1992 [DE] Germany ............... 42 04 949.0

[51] Int. Cl.⁶ ............... G03C 1/795; G03F 7/027; G03F 7/34
[52] U.S. Cl. ............... 430/260; 430/253; 430/254; 430/257; 430/293; 430/281.1; 430/288.1; 430/920; 430/925; 430/926
[58] Field of Search ............... 430/257, 258, 430/281.1, 288.1, 260, 920, 925, 926, 253, 254, 293

[56] References Cited

U.S. PATENT DOCUMENTS

| | | | |
|---|---|---|---|
| 3,987,037 | 10/1976 | Bonham et al. | 430/920 |
| 4,189,323 | 2/1980 | Buhr | 430/281 |
| 4,505,793 | 3/1985 | Tamoto et al. | 430/920 |
| 4,895,787 | 1/1990 | Platzer | 430/257 |
| 4,935,331 | 6/1990 | Platzer et al. | 430/257 |
| 4,997,745 | 3/1991 | Kawamura et al. | 430/281 |
| 5,030,548 | 7/1991 | Fujikura et al. | 430/288 |
| 5,049,476 | 9/1991 | Platzer | 430/253 |
| 5,298,361 | 3/1994 | Bonham | 430/920 |
| 5,534,384 | 7/1996 | Platzer et al. | 430/260 |

FOREIGN PATENT DOCUMENTS 0 503 674   9/1992   European Pat. Off.

Primary Examiner—John S. Chu
Attorney, Agent, or Firm—Foley & Lardner

[57] ABSTRACT

A photosensitive material for the production of color proofing films for multicolor printing, having (A) a transparent, flexible film support,
(B) a photopolymerizable layer which contains
   (B1) a polymeric binder,
   (B2) a free-radical-polymerizable compound,
   (B3) a substituted bistrihalomethyl-s-triazine having an absorption maximum in the range from 300 to 380 nm and an absorbance of greater than 11,000 at the absorption maximum, and an absorbance of less than 1400 at 400 nm and above, as photoinitiator, and
   (B4) a dye or a colored pigment in a primary color of multicolor printing, and
(C) a thermoplastic adhesive layer on the photo-sensitive layer.

The material is processed by lamination onto an image-receiving material, exposure of the material and peeling apart of film support and image-receiving material, leaving the unexposed layer areas on the image-receiving material together with the adhesive layer. To produce a multicolored image, these steps are repeated with at least one further single-color sheet. The material has increased photosensitivity and gives color prints with lower background discoloration.

21 Claims, No Drawings

PROCESS FOR THE PRODUCTION OF A MULTICOLORED IMAGE AND PHOTOSENSITIVE MATERIAL FOR CARRYING OUT THIS PROCESS

BACKGROUND OF THE INVENTION

1. Field of the Invention

The invention relates to a photosensitive, in particular photopolymerizable, material for the production of color proofing films for controlling color separations which are used to expose printing plates for multicolor printing. It furthermore relates to a color proofing method in which a multicolored image comprising a plurality of single-color images in register is produced on an image-receiving material. The single-color images are produced by laminating a film support coated with a photopolymerizable layer which has been dyed in a primary color onto the image-receiving material, exposing the layer with the corresponding color separation, and developing the image by peeling off the film support with the non-image areas from the image-receiving material. A multicolored image is formed by repeating the same steps with photopolymerizable layers in other primary colors.

2. Description of Related Art

A color proofing method of this general type and a material intended for this purpose are described in U.S. Pat. Nos. 4,895,787 and 5,049,476. This material comprises a transparent film support, the surface of which has preferably been adhesion pretreated, a photopolymerizable layer which contains a dye or a colored pigment in a primary color of multicolor printing, and a heat-activatable adhesive layer on the photopolymerizable layer. The material is laminated onto an image-receiving material, exposed through the film support, and then developed by peeling off the film support from the image-receiving material, leaving the exposed areas of the colored photosensitive layer on the support, and the non-exposed areas together with the adhesive layer on the image-receiving material. The method thus works positively, i.e., a positive copy of the original is produced on the image-receiving material.

This processing method has the advantage of not requiring any alkaline or acidic solutions, nor organic solvents for development; disposal of these is therefore unnecessary. A disadvantage of this method is the relatively low photosensitivity of the photosensitive material employed therein.

Although the photosensitivity can be improved by selecting a more active photoinitiator, such initiators generally have higher light absorption in the visible spectral region, which causes significant discoloration in the background, i.e., the non-image areas, of the proof so that the color impression of the finished multicolored image is rendered incorrect.

SUMMARY OF THE INVENTION

An object of the invention is to provide a photo-sensitive material and a color proofing method of the type described at the outset which has higher photo-sensitivity without any discoloration of the image background.

It is also an object of the present invention to provide a process for the production of a single-color or multicolored image using such a photosensitive material.

It is a further object of the present invention to provide single-color and multicolored images produced by these processes.

In accomplishing the foregoing objectives, there is provided, in accordance with one aspect of the present invention, a color proofing film, containing (A) a transparent, flexible plastic film support;
(B) a photopolymerizable layer which contains
   (B1) a polymeric binder,
   (B2) a free-radical-polymerizable compound,
   (B3) a substituted bistrihalomethyl-s-triazine having an absorption maximum in the range from about 300 to about 380 nm and an absorbance of greater than about 11,000 at the absorption maximum, and an absorbance of less than about 1400 at 400 nm and above, which initiates the polymerization of (B2) on exposure to actinic light, and
   (B4) a dye or a colored pigment in a primary color of multicolor printing; and
(C) a thermoplastic adhesive layer on the photo-sensitive layer.

In accordance with another aspect of the present invention there is provided a process for the production of a multicolored image comprising the steps of:

(a) laminating the above described photosensitive material by means of the adhesive layer at elevated temperature and pressure onto an image-receiving material, (b) imagewise exposing the photosensitive material through the film support with a color separation before or after the lamination, (c) peeling off the film support together with the exposed areas of the photopolymerizable layer from the image-receiving material, producing a single-color image on the image-receiving material, (d) repeating steps (a)–(c) with at least one further color separation, whereby the exposure is carried out in register with the first single-color image produced on the image-receiving material.

In accordance with another object of the present invention, there is provided a multicolored image which is produced by the above method.

Further objects, features, and advantages of the present invention will become apparent from the detailed description of preferred embodiments which follows.

DETAILED DESCRIPTION OF THE PREFERRED EMBODIMENTS

The photopolymerizable layer of the material according to the invention contains a polymeric binder, a free-radical-polymerizable compound, a photoinitiator of the bistrihalomethyl-s-triazine type, in particular of the bistrichloromethyl-s-triazine type, and a dye or colored pigment in a primary color of multicolor printing. Examples of photopolymerizable layers of this general composition are described in U.S. Pat. No. 4,895,787, which is hereby incorporated by reference, in its entirety.

The bistrihalomethyl-s-triazine must satisfy the above-mentioned conditions, i.e., it must have an absorption maximum in the range from 300 to 380 nm, preferably from 320 to 350 nm, and must not exceed a minimum absorbance in the spectral region above 400 nm.

Substituted trihalomethyltriazines of the type to be employed according to the invention are known and are described, for example, in U.S. Pat. Nos. 3,987,037 and 4,189,323, both of which are hereby incorporated by reference.

Of the compounds described therein, however, the only ones suitable in the present invention are those which satisfy the above-mentioned absorption conditions. Use of these compounds is not mentioned anywhere in the patent specifications which describe the color proofing films of the type mentioned at the outset.

Any bistrihalomethyl-s-triazine having the described characteristics can be used in the present invention. Preference is given to 2-aryl- or 2-arylalkenyl-4,6-bistrihalomethyl-s-triazines. Suitable aryl groups are monocyclic or polycyclic, in particular monocyclic, aromatic groups, which may, if desired, be substituted by one or more alkyl, alkoxy, alkylenedioxy, phenyl or phenoxy groups. Preferred arylalkenyl groups are styryl groups, which may, if desired, carry identical substituents on the aromatic ring.

The amount of the photoinitiator (B3) can be varied depending on desired results and is generally between about 1 and about 25% by weight, preferably between about 5 and about 15% by weight, based on the weight of the solid photopolymerizable layer.

The polymeric binder is intended to provide the layer with homogeneity and strength. The binder may be any known in the art which provides the needed characteristics. Suitable binders include styrene-maleic anhydride and styrene-maleic acid monoester copolymers, acrylate polymers and copolymers, polyamides, polyvinylpyrrolidones, cellulose derivatives, such as cellulose esters and ethers, phenolic resins, polyvinyl esters, polyvinyl acetals, for example, polyvinylbutyral, -propional or -formal. The amount of the binder can be varied depending on desired results and is generally from about 15 to about 70% by weight, preferably from about 20 to about 50% by weight, based on the weight of the solid layer.

The polymerizable compound contains at least one, preferably at least two, terminal ethylenically unsaturated groups. Any such polymerizable compound known in the art, or mixtures thereof, can be used. The compound should generally not be gaseous at temperatures below 100° C. at atmospheric pressure. Preference is given to esters and amides of acrylic and methacrylic acid. Particular preference is given to esters with polyhydric alcohols. Examples are di-, tri-, tetra- and polyethylene glycol di(meth)acrylate, the di(meth)acrylates of oligo- and polypropylene glycols, 1,4-butanediol di(meth)acrylate, trimethylolpropane and trimethylolethane di- and tri(meth)acrylate, pentaerythritol tri- and tetraacrylate or -methacrylate, dipentaerythritol tetra-, penta- and hexa(meth) acrylate. The amount of polymerizable compound is chosen depending on the desired final product and is generally from about 15 to about 70% by weight, preferably from about 20 to about 60% by weight of the photopolymerizable layer.

The dyes or colored pigments are selected so that they correspond to the primary colors of multicolor printing; i.e., cyan, magenta, yellow and black. Any known dyes or colored pigments can be used. Pigments are generally preferred. Examples include Permanent Yellow G (C.I. 21 095), Permanent Yellow GR (C.I. 21 100), Permanent Yellow DHG (C.I. 21 090), Permanent Ruby L6B (C.I. 15 850:1), Permanent Pink F3B (C.I. 12 433), Hostaperm Pink E (C.I. 73 915), Hostaperm Red-Violet ER (C.I. 46 500), Permanent Carmine FBB (C.I. 12 485), Hostaperm Blue B2G (C.I. 74 160), Hostaperm Blue A2R (C.I. 74 160) and Printex® 25 (carbon black). The pigments can, if desired, be blended in order to achieve the desired hue. The inorganic or organic pigments are generally dispersed or slurried in a suitable solvent together with some of the binder. The mean particle size of the pigments is generally less than about 1 μm.

The amount of the dye or pigment used depends on the desired color density to be achieved, and is generally from about 8 to about 40% by weight, preferably from about 12 to about 30% by weight.

The photopolymerizable layer may, if desired, contain further constituents, such as hydrogen donors, sensitizers, polymerization inhibitors, plasticizers, residual solvents, surfactants, surface-levelling agents, lubricants, antistatics, inert fillers, optical brighteners and/or UV absorbers. The photopolymerizable layer generally has a layer weight of from about 0.2 to about 5 g/m$^2$, preferably from about 0.3 to about 3 g/m$^2$.

After the photopolymerizable layer has been dried, a heat-activatable, thermoplastic adhesive layer is applied thereto. The adhesive layer can be any adhesive layer which performs the desired function of being able to be laminated to an image-receiving material. The application can be accomplished in any desired manner, for example, the adhesive layer can be applied directly either from a solvent or from a solvent mixture which does not dissolve the photopolymerizable layer, and then dried. It may also first be applied to a temporary base film and transferred therefrom to the photopolymerizable color layer by lamination and peeling off of the base film. In another embodiment, the adhesive layer can be obtained by coating the image-receiving material from a solvent and drying the coating. The photopolymerizable layer is then transferred by lamination onto the adhesive layer obtained in this way.

Direct application from solvents of the adhesive layer onto the photopolymerizable layer is preferred. Suitable solvents that do not dissolve the color layer are water and saturated hydrocarbons. Many polymers can be applied from aqueous dispersion; however, application from solution is preferred. Examples of suitable polymers for the adhesive layer are salts of polymers containing acid groups, for example, carboxyl groups. A preferred example is an aqueous-alkaline solution of a vinyl acetate-crotonic acid copolymer (Mowilith Ct 5). Other suitable polymers are polyvinyl acetate or polyacrylate dispersions. The polymer should generally have a softening point in the range from about 40° to about 200° C., preferably from about 60° to about 120° C.

In addition to the thermoplastic polymer, the adhesive layer may also contain plasticizers, residual solvents, surface-levelling agents, lubricants, antistatics, optical brighteners and/or UV absorbers. The layer weight of the adhesive layer in the dry state is normally from about 2 to about 30 g/m$^2$, preferably from about 4 to about 15 g/m$^2$. Suitable adhesive layers are also described in U.S. Pat. No. 4,895,787, which is hereby incorporated by reference.

The film supports employed are transparent, flexible, dimensionally-stable films made from plastics. Any such plastic can be used, for example, polyesters, polycarbonates, and the like. Particular preference is given to polyester films, in particular, biaxially-stretched and thermofixed films, for example, made from polyethylene terephthalate. These should be dimensionally stable at the lamination temperatures necessary, i.e., at temperatures between about 60° and about 150° C. Their thickness is generally from about 10 to about 200 μm, preferably from about 25 to about 80 μm. The film support is advantageously adhesion-pretreated on one or both sides and may have a smooth or a rough or matte surface, a smooth surface being preferred.

In order to carry out the process according to the invention, the above-described photosensitive material is laminated by means of the adhesive layer onto an image-receiving material. The latter can comprise plastic, plastic-coated special paper or normal printing paper. Other white or, if desired, non-white receiving materials can likewise be used. A printing paper which retains its dimensions under the laminating conditions is usually preferred since this allows a visual impression very close to the later print to be achieved. A method of using such printing paper is described in European Patent Specification No. 294,665, which is included herein by reference. The lamination is expediently carried out in equipment provided for this purpose under pressure and, preferably, at elevated temperature. The lamination temperature is usually in the range from about 60° to about 130° C., preferably between about 70° and about 100° C.

Before or preferably after the lamination, the photopolymerizable layer is exposed imagewise in a known manner through the film support, generally in contact with a positive color separation film. After the exposure, the film support is peeled off by hand or in a suitable device. The peel angle should be at least 90°, an angle of 180° being particularly preferred. The exposed areas of the photopolymerizable layer are removed with the base film, while the unexposed areas remain on the image-receiving material together with the adhesive layer. In this way, a positive single-color image is obtained.

Each further color proofing film is laminated onto the previous single-color image in the manner described, exposed thereon in register and developed by peeling off the film support. In this way, a full multicolored proof which corresponds to the later 4-color print can be produced from the single-color images in the colors cyan, magenta, yellow and black. If required, it is of course also possible to employ color proofing films in other colors.

The finished multicolored proof has a glossy surface. If desired, the surface can be rendered matte by, for example, laminating a film having a rough texture onto the glossy layer surface and peeling it off again. The surface of the finished proof can be protected against scratching and blocking at elevated temperatures by means of a protective layer.

The invention is described by means of the Examples below. All percentages and amount ratios are given in units by weight.

EXAMPLES 1 TO 13

Coating solutions of the following composition were applied to biaxially-stretched and thermofixed polyethylene terephthalate films with a thickness of 50 μm which had been pretreated on both sides (Melinex® 454) in order to improve the adhesion, and the coatings were dried:

35.4 parts of dipentaerythritol pentaacrylate, 36.5 parts of polyvinylformal (Formvar® 12/85), 18.5 parts of Permanent Carmine FBB (C.I. 12 485), 0.6 parts of silicone oil as flow-control agent (Edaplan® LA 411) and 7.8 parts of photoinitiator as in Table 1, in 1000 parts of tetrahydrofuran, 680 parts of 1-methoxypropan-2-ol and 190 parts of butyrolactone.

The dry layer had a weight of 0.83 g/m². This layer was coated with a solution of 96.7 parts of vinyl acetate-crotonic acid copolymer (95:5)

1.9 parts of polyvinyl methyl ether (Lutonal® M 40), and 1.4 parts of sodium sulfite in 520 parts of water, 43 parts of ethanol and 8.5 parts of aqueous ammonia (25% strength), and dried to give an adhesive layer weight of 6.5 g/m².

The photosensitive material obtained was laminated with the adhesive layer onto a receiving sheet of paper, exposed through the film support under a magenta color separation and developed by peeling apart the film and the receiving sheet. A positive magenta single-color image of the master remained on the receiving sheet.

COMPARATIVE EXAMPLES A TO H

Photosensitive color proofing films were produced in the same manner as in Examples 1 to 13 and processed to give single-color images, using, for comparison, the known photoinitiators indicated in Table 1.

Table 1 shows the exposure time necessary for optimum resolution, the extent of background discoloration, the absorption maximum of the photoinitiator ($\lambda_{max}$), the molar absorbance at this wavelength ($\epsilon_{max}$) and the molar absorbance at 400 nm ($\epsilon_{400}$). The background discoloration is given relative to the yellowish discoloration in Comparative Example D, 0 indicating the same degree of discoloration, + indicating a greater degree of discoloration and − indicating a lesser degree of discoloration.

TABLE 1

| Example | $\lambda_{max}$ (nm) | $\epsilon_{max}$ | $\epsilon_{400}$ | Exposure time (seconds) | Discoloration |
|---|---|---|---|---|---|
| 1 | 331 | 28,800 | <100 | 18 | — |
| 2 | 331 | 50,500 | <100 | 15 | — |
| 3 | 332 | 30,800 | <100 | 15 | — |
| 4 | 332 | 29,500 | <100 | 30 | — |
| 5 | 333 | 28,200 | <100 | 50 | — |
| 6 | 336 | 31,100 | <100 | 45 | — |
| 7 | 337 | 15,900 | 550 | 15 | — |
| 8 | 350 | 17,400 | 160 | 50 | — |
| 9 | 351 | 33,300 | 125 | 21 | — |
| 10 | 352 | 17,700 | 655 | 50 | — |
| 11 | 355 | 17,450 | 650 | 30 | — |
| 12 | 356 | 37,800 | 140 | 15 | — |
| 13 | 363 | 11,300 | 1,200 | 10 | — |
| A | 331 | 11,900 | <100 | 400 | — |
| B | 363 | 28,600 | 9,300 | 100 | 0 |
| C | 365 | 32,900 | 5,800 | 40 | 0 |
| D | 368 | 13,900 | 2,560 | 30 | 0 |
| E | 370 | | | 200 | + |
| F | 371 | 41,400 | 20,800 | 2 | + |
| G | 388 | 25,000 | 21,300 | 50 | + |
| H | 394 | 34,920 | 32,900 | 4 | + |

| | Initiators used |
|---|---|
| Example | Initiator |
| 1 | 2-(4-methoxyphenyl-4,6-bis-trichloromethyl-s-triazine |
| 2 | 4,4'-bis[4,6-bistrichloromethyltriazinyl-(2)-]diphenyl ether |
| 3 | 2-biphenyl-4-yl-4,6-bistrichloromethyl-s-triazine |
| 4 | 2-(4-n-butoxyphenyl)-4,6-bistrichloromethyl-s-triazine |
| 5 | 2-(4-ethoxyphenyl)-4,6-bistrichloromethyl-s-triazine |
| 6 | 2-styryl-4,6-bistrichloromethyl-s-triazine |
| 7 | 2-(3,4,5-trimethoxyphenyl)-4,6-bistrichloromethyl-s-triazine |
| 8 | 2-(2,4-dimethoxyphenyl)-4,6-bistrichloromethyl-s-triazine |
| 9 | 2-(4-methylstyryl)-4,6-bistrichloromethyl-s-triazine |
| 10 | 2-(3,4-dimethoxyphenyl)-4,6-bistrichloromethyl-s-triazine |
| 11 | 2-(3,4-methylenedioxyphenyl)-4,6-bistrichloromethyl-s-triazine |
| 12 | 2-fluoren-2-yl-4,6-bistrichloromethyl-s-triazine |
| 13 | 2-naphth-1-yl-4,6-bistrichloromethyl-s-triazine |
| A | 4-(4-methoxyphenyl)-6-trichloromethyl-2-pyrone |
| B | 4-(4-methoxystyryl)-6-trichloromethyl-2-pyrone |
| C | bis-(4-dimethylaminophenyl) ketone/2-mercaptobenzothiazole/ (bis-2,4,5-triphenylimidazole) (2:2:4) |
| D | 2,3-bis(4-methoxyphenyl)quinoxaline |
| E | 4-(4-styrylphenyl)-6-trichloromethyl-2-pyrone |
| F | 2-(4-styrylphenyl)-4,6-bistrichloromethyl-s-triazine |
| G | 2-[4-ethoxynaphth-1-yl]-4,6-bistrichloromethyl-s-triazine |
| H | 2-(4-trichloromethylbenzoylmethylene)-3-ethylbenzothiazoline |

The background discoloration depends on the amount of initiator and on its absorption in the visible spectral region, approximately from 400 to 700 nm. If the amount is the same, the discoloration is determined to a first approximation by the absorbance at 400 nm. The background is generally colorless for initiators having $\epsilon_{400}$ values of below about 1400. In the case of initiators having $\epsilon_{400}$ values of from about 1400 to 8000, a slight yellow coloration is visible. At values above 8000, the discoloration is obvious and the print is unsuitable for color proofing.

The mixture of Comparative Example C corresponds to the initiator combination of Example 6 in U.S. Pat. No. 5,049,476. The values given in the table for $\lambda_{max}$ and $\epsilon$ are those of bis(4-dimethylaminophenyl) ketone.

EXAMPLE 14

In order to produce color proofing films in the four primary colors, the following solutions

| Constituent | Parts by weight | | | |
|---|---|---|---|---|
| | Cyan | Magenta | Yellow | Black |
| Dipentaerythritolpentaacrylate | 39.0 | 35.5 | 38.2 | 36.1 |
| Polyvinylformal (Formvar ® 12/85) | 31.3 | 36.5 | 35.4 | 28.9 |
| 2-Biphenyl-4-yl-4,6-bistrichloro-methyl-s-triazine | 9.8 | 7.8 | 9.5 | 9.6 |
| Hostaperm Blue B2G (C.I. 74160) | 19.0 | — | — | — |
| Permanent Carmine FBB (C.I. 12485) | — | 18.5 | — | — |
| Permanent Yellow GR (C.I. 21100) | — | 0.7 | 16.4 | — |
| Carbon Black (Printex ® 25) | 0.4 | 0.5 | — | 24.8 |
| Silicone oil as in Example 4 | 0.5 | 0.5 | 0.5 | 0.6 |
| Tetrahydrofuran | 1000 | 1000 | 1000 | 1000 |
| 1-Methoxypropan-2-ol | 680 | 680 | 680 | 680 |
| Butyrolactone | 190 | 190 | 190 | 190 | were applied to polyester films as used in Examples 1–13, and were dried. The colored pigments were first dispersed in a solution of some of the polyvinylformal in butyrolactone and ground to give a mean particle size of less than 0.2 µm. The dry layer weights of the four films were as follows:

Cyan 0.58 g/m²
Magenta 0.83 "
Yellow 0.75 "
Black 0.67 "

The photosensitive layer was in each case coated with an adhesive layer solution of the composition indicated in Examples 1–13 and dried to give an adhesive layer weight of 6.5 g/m².

The cyan film was laminated with the adhesive layer onto a paper receiver at 85° C. and was exposed through the film support under a cyan color separation. The film support was then peeled off the receiving sheet, the unexposed areas of the layer remaining on the receiving sheet. In the same way, the magenta, yellow and black films were laminated successively onto the receiving sheet on top of the previous single-color image, exposed under the corresponding color separation and developed by peeling off the film support. In this way, a four-color image corresponding to the original master was obtained on the receiving sheet. The resolution—irrespective of the peel-off direction of the film support—was at least 15 µm. With a 60 lines/cm screen, the dot reproduction range was from 2 to 98%. The exposure times necessary were 16 seconds for cyan, 10 seconds for magenta, 12 seconds for yellow and 24 seconds for black. The background of the four-color proof had an optical density of 0.02, measured using the yellow filter of a densitometer.

COMPARATIVE EXAMPLE I

Example 14 was repeated, but the trichloromethyltriazine employed therein was replaced by the quinoxaline mentioned in Comparative Example D. The exposure times were 32 seconds for cyan, 24 seconds for magenta, 32 seconds for yellow and 64 seconds for black. The background of the four-color proof had an optical density of 0.05.

What is claimed is:

1. A photosensitive material for the production of color proofing films containing
   (A) a transparent, flexible plastic film support,
   (B) a photopolymerizable layer which consists essentially of
      (B1) a polymeric binder,
      (B2) a free-radical-polymerizable compound,
      (B3) a substituted bistrihalomethyl-s-triazine having an absorption maximum in the range from about 300 to about 380 nm and an absorbance of greater than about 11,000 at the absorption maximum, and an absorbance of less than about 1400 at 400 nm and above, which initiates the polymerization of (B2) on exposure to actinic light, wherein the substituted bistrihalomethyl-s-triazine has a molecular weight of 482 or less per substituted triazine unit, and
      (B4) a colored pigment in a primary color of multicolor printing, and
   (C) a thermoplastic adhesive layer on the photo-sensitive layer,
   wherein the photopolymerizable layer comprises based on the weight of the photopolymerizable layer about 12 to about 40% by weight of (B4).

2. A photosensitive material as claimed in claim 1, wherein (B3) is a substituted bistrichloromethyl-s-triazine.

3. A photosensitive material as claimed in claim 1, wherein the absorption maximum of compound (B3) is in the range from about 320 to about 350 nm.

4. A photosensitive material as claimed in claim 1, wherein compound (B3) is a 2-aryl- or 2-arylalkenyl-4,6-bistrichloromethyl-s-triazine.

5. A photosensitive material as claimed in claim 4, wherein (B3) is a 2-aryl-4,6-bistrichloromethyl-s-triazine, wherein the aryl is a monocyclic, aromatic group.

6. A photosensitive material as claimed in claim 4, wherein (B3) is a 2-arylalkenyl-4,6,-bistrichloromethyl-s-triazine, wherein the arylalkenyl is a styryl group.

7. A photosensitive material as claimed in claim 1, wherein the photopolymerizable layer comprises about 15 to about 70% by weight of the polymeric binder, about 15 to about 70% by weight of the free-radical-polymerizable compound, and about 5 to about 15% by weight of (B3).

8. A photosensitive material as claimed in claim 1, wherein the free-radical-polymerizable compound (B2) contains at least two polymerizable groups.

9. A photosensitive material as claimed in claim 1, wherein the free-radical-polymerizable compound (B2) is an acrylic or methacrylic acid ester.

10. A photosensitive material as claimed in claim 1, wherein the thermoplastic adhesive layer has a glass transition temperature of from about 20° to about 100° C.

11. A photosensitive material as claimed in claim 1, wherein the thermoplastic adhesive layer has a weight of from about 2 to about 30 g/m².

12. A photosensitive material as claimed in claim 1, wherein the photopolymerizable layer has a weight of from about 0.2 to about 5 g/m².

13. A photosensitive material as claimed in claim 1, wherein (B4) is an organic or inorganic pigment having a mean particle size of less than about 1 micrometer.

14. A photosensitive material as claimed in claim 1, wherein the film support is a polyethylene terephthalate film.

15. A photosensitive material as claimed in claim 14, wherein the polyethylene terephthalate film is biaxially stretched and thermofixed.

16. A photosensitive material as claimed in claim 1, wherein the adhesive layer comprises a salt of a polymer containing acidic groups.

17. A photosensitive material as claimed in claim 1, wherein the plastic film support has a thickness from about 10 to about 200 micrometers.

18. A photosensitive material as claimed in claim 1, wherein the plastic film support is adhesion-pretreated on one or both sides thereof.

19. A photosensitive material as claimed in claim 1, wherein the photoinitiator present in the material consists essentially of (B3).

20. A photosensitive material as claimed in claim 1, wherein the photoinitiator present in the material consists of (B3).

21. A photosensitive material as claimed in claim 1, wherein the thermoplastic adhesive layer comprises a polymer selected from the group consisting of salts of polymers containing acid groups, a polyvinyl acetate, and a polyacrylate.

* * * * *